United States Patent
Bilinskis et al.

(10) Patent No.: US 7,046,183 B2
(45) Date of Patent: May 16, 2006

(54) METHOD AND APPARATUS FOR ALIAS SUPPRESSED DIGITIZING OF HIGH FREQUENCY ANALOG SIGNALS

(75) Inventors: Ivars Bilinskis, Riga (LV); Juris Artjuhs, Riga (LV)

(73) Assignee: Institute of Electronics and Computer Sciences of Latvia, Riga (LV)

( * ) Notice: Subject to any disclaimer, the term of this patent is extended or adjusted under 35 U.S.C. 154(b) by 0 days.

(21) Appl. No.: 10/501,707

(22) PCT Filed: Jan. 17, 2003

(86) PCT No.: PCT/IB03/00110

§ 371 (c)(1),
(2), (4) Date: Feb. 23, 2005

(87) PCT Pub. No.: WO03/061133

PCT Pub. Date: Jul. 24, 2003

(65) Prior Publication Data

US 2005/0151678 A1    Jul. 14, 2005

(30) Foreign Application Priority Data

Jan. 17, 2002    (EP)    .................................. 02001249

(51) Int. Cl.
*H03M 1/12*    (2006.01)

(52) U.S. Cl. ........................ 341/155; 341/143; 341/156
(58) Field of Classification Search ................ 341/143, 341/155, 156, 122, 123, 126
See application file for complete search history.

(56) References Cited

U.S. PATENT DOCUMENTS 4,694,244 A * 9/1987 Whiteside et al. ...... 324/121 R
6,218,982 B1 * 4/2001 Shirai et al. ................. 342/118

* cited by examiner

*Primary Examiner*—John B Nguyen
(74) *Attorney, Agent, or Firm*—Friedrich Kueffner

(57) ABSTRACT

A method and apparatus for sampling an analog input signal and storing digital values in a memory, wherein a sequence of clock pulses is generated at a predetermined frequency and a pseudo-random integer is generated at every sampling pulse. The sequence of clock pulses is divided by the integer to select one last pulse from every series of clock pulses. A sequence of sampling pulses is formed by generating a second pseudo-random integer and delaying the selected clock pulse. An analog input signal at the delayed clock pulse is sampled and converted to a predetermined digital format. The current signal sample value is stored in a memory.

4 Claims, 4 Drawing Sheets

*A schematic block diagram of the present invention*

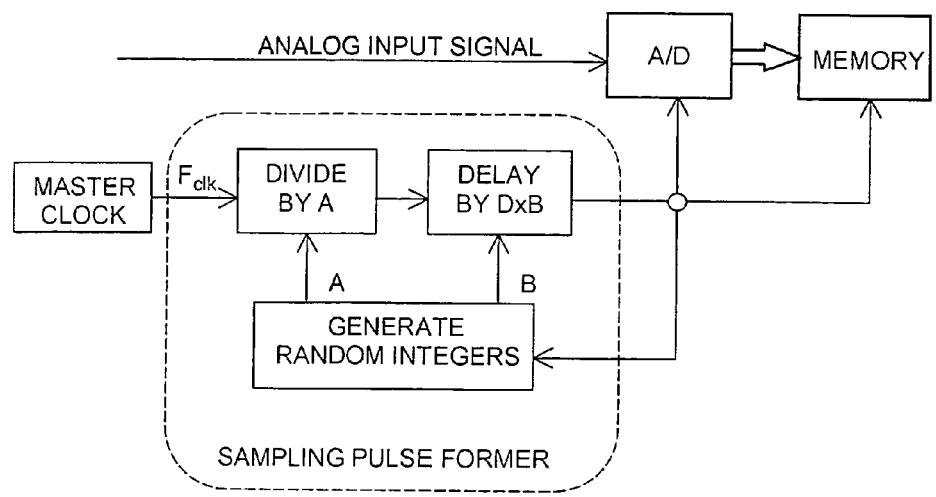
FIG.1. A schematic block diagram of the present invention

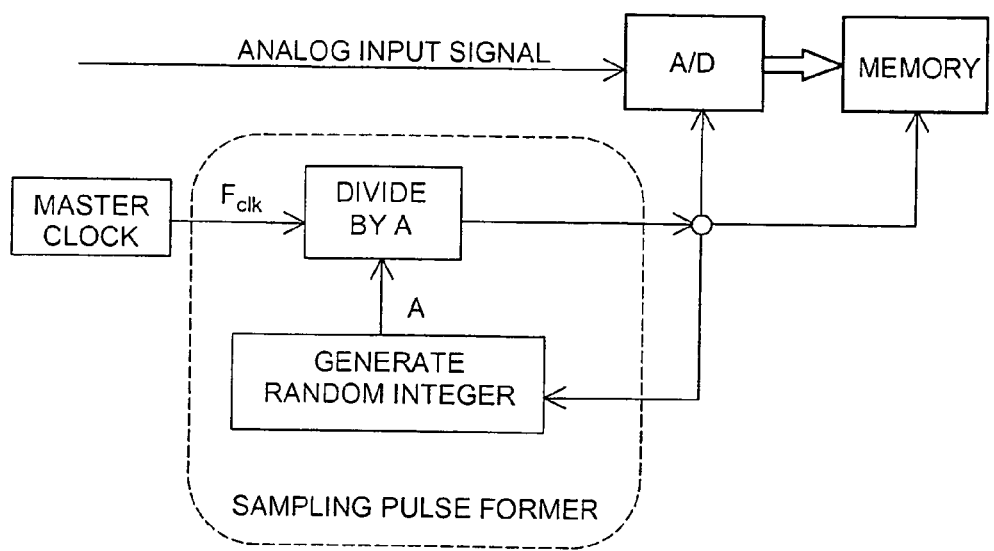
FIG. 2. A schematic block diagram of a priori art circuit

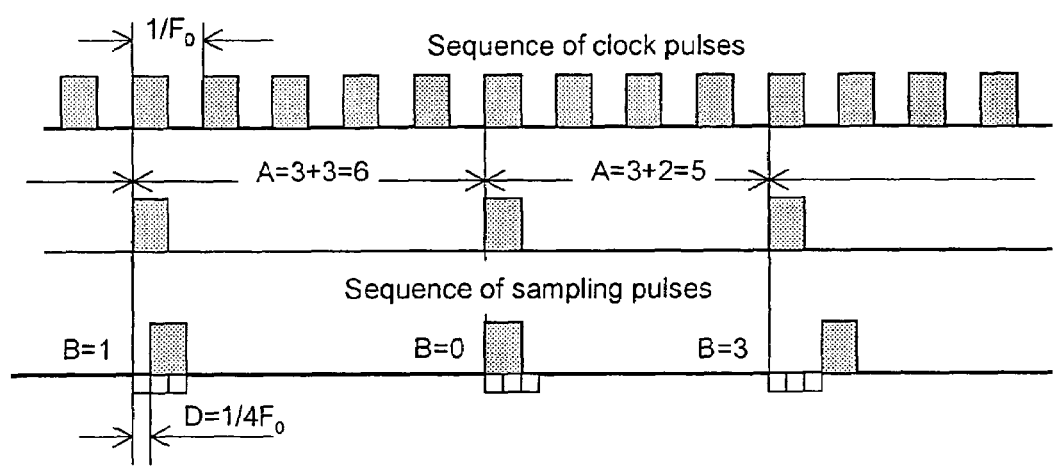
FIG.3. A time diagram showing the manner in which the sampling pulses are formed

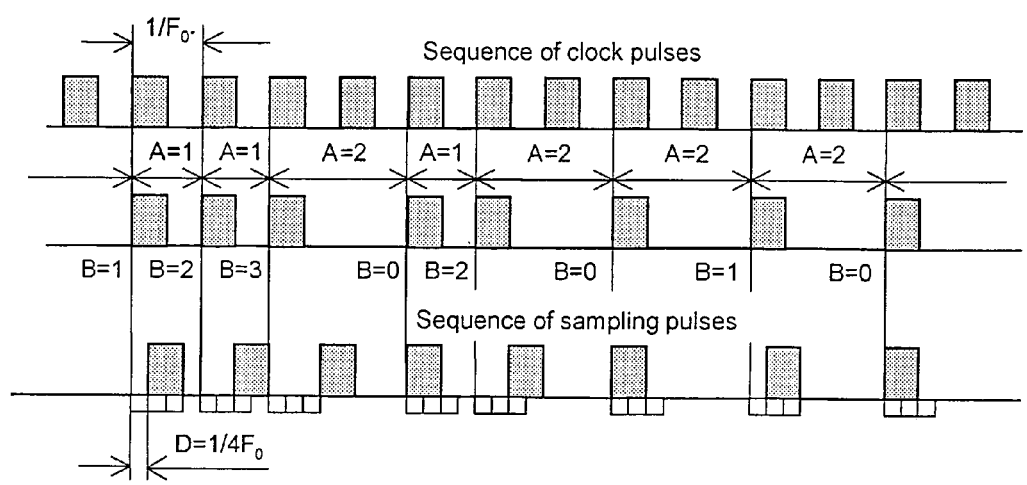
FIG.4. A time diagram showing the manner in which the sapling pulse sequence is adapted to the highest rate operation

METHOD AND APPARATUS FOR ALIAS SUPPRESSED DIGITIZING OF HIGH FREQUENCY ANALOG SIGNALS

BACKGROUND OF THE INVENTION

1. Field of the Invention

The present invention relates generally to the field of analog signal digitizing. More specifically the present invention is addressed to a problem of alias suppressed signal sampling at a frequency considerably lower than the upper frequency of the said analog signal. A method and apparatus covered by the invention are adapted to digitizing the high frequency signals in applications related to versatile digital signal processing (e.g. oscilloscope).

2. Description of Prior Art

For many types of the analog-to-digital (A/D) converters, the upper frequency boundary $F_{BW}$ of the front-end bandwidth exceeds the allowed maximum sampling rate $F_S$ considerably. For example, the A/D converter AD9433 from "Analog Devices, Inc.", at the bandwidth $F_{BW}$=700 MHz, is characterized by the maximum sampling rate $F_S$=125 MHz. Therefore, in the cases when such A/D converters are incorporated into electronic designs based on exploitation of the conventional equidistant (uniform or periodic) sampling, the upper frequency of the analog signals at the input of the said converter has to be limited down to the level equal to $F_S/2$ (Nyquist limit) to protect the digitized signal against aliasing.

The aliasing phenomenon is well known. The essence of it is the fact that in the cases where the original analog signal has frequencies exceeding half of the sampling rate the frequency overlapping occurs so that different frequencies might be represented by exactly the same data set and, generally, the digitized output signal bears no real relationship to the actual input signal. Therefore, to avoid aliasing in the case of the mentioned example, the upper frequency of the input analog signals has to be limited down to 62.5 MHz, to the frequency 11 times lower than the offered bandwidth of this A/D converter. In other words, the traditional approach to sampling and processing of the equidistantly sampled signals often leads to substantial underexploitation of the bandwidth resource of the involved A/D converter.

It is known that signal sampling at predetermined non-uniformly spaced time instants can be applied for sampling an analog signal with aliasing substantially suppressed even when the mean sampling frequency $F_{SA}$ is essentially lower than $F_{BW}$ (see [1–2]). In this case, the upper frequency $F_{BW}$ of input analog signal spectra is limited by the minimal digital increment D of the sampling interval variation, so that $F_{BW}<\frac{1}{2}D$.

However the said known methods and means for non-uniform signal sampling at predetermined time instants are oriented to fully digital implementations based on application of a special digital device controlling the sampling process at a given clock frequency $F_{clk}$ in such a way that the achievable minimum value of D, determining the upper frequency of the input signal spectrum, is directly related to the maximum of the clock frequency $F_{clk}$ at which the involved logic circuits still can function properly. For example, this maximum clock frequency $F_{clk}$ should be at least 1.4 GHz to achieve the possibility of exploiting the whole 700 MHz bandwidth of the mentioned A/D converter. As bandwidths of the present-day A/D converters can be even much wider than 700 MHz, suppression of aliasing within the whole frequency range of their bandwidths, if attempted on the basis of the said non-uniform sampling method, would require usage of substantially higher clock frequencies measured in GHz. That clearly is not acceptable as the corresponding electronic implementations then, even when possible, would be very complicated and expensive.

Thus, to achieve alias suppression at digitizing wideband analog signals, the problem of reducing the value of the smallest clock interval digital increment D to sufficiently small values has to be resolved in a way providing that the value of D does not directly depend on the clock frequency $F_{clk}$ used. For digitizing signals with the upper frequencies in hundreds of MHz and even GHz, the values of D, evidently, have to be as small as a few tens or hundreds of picoseconds.

SOLUTION TO THE PROBLEM

The present invention addresses this problem of increasing the upper frequency of the analog signal being digitized in an alias suppressing way by sampling that input signal at time instants corresponding to the pseudo-randomly selected clock pulses which are additionally delayed for pseudo-random values. This results in the signal upper frequency restricted only by the minimum increment of the pulse delay variation.

SUMMARY OF THE INVENTION

This invention provides, a method and apparatus for alias suppressed digitizing of high frequency analog signals, comprising variable-variance sampling of the said signals at mean frequencies considerably lower than the upper frequencies in spectra of the said signals. A clock produces a sequence of electrical pulses at a predetermined frequency $F_{clk}$. This sequence is divided by a pseudo-random integer A to select one pulse from every series of A clock pulses. A digitally controllable delay block delays the selected pulse by a pseudo-random delay D×B, where D is a constant increment of the delay and B is a pseudo-random integer. An analog-to-digital (A/D) converter samples the input signal at the time instant of the said delayed pulse. A memory receives and stores the digital sample value from the output of the A/D converter. Said integers A and B are changed after every sampling event.

A primary object of the present invention is to provide a method and apparatus to substantially increase the upper frequency of alias-free analog signal digitizing.

Another object of the present invention is to provide a method and apparatus to adapt the primary object to input signal digitizing at the highest sampling rate.

BRIEF DESCRIPTION OF THE DRAWING

FIG. 1 is a schematic block diagram of the apparatus according to the present invention;

FIG. 2 is a schematic block diagram of a prior art circuit;

FIG. 3 is a time diagram showing the manner in which the sampling pulses are formed;

FIG. 4 is a time diagram showing the manner in which the sampling pulse sequence is adapted to the highest rate operation.

DETAILED DESCRIPTION OF THE INVENTION

FIG. 2 provides a simplified block diagram illustrating the manner in which the input signal is sampled and the obtained digital sample values stored in the memory of the prior art embodiment used for implementation of the conventional approach to alias suppressed signal sampling.

To obtain a sampling pulse, the sequence of the clock pulses is digitally divided by a predetermined pseudo-random integer A so, that one last pulse is selected from each series of A clock pulses. The variable A assumes a value from K to K+N, where K is the constant part of the integer A determining the minimum K/F$_{clk}$ of the interval between any pair of two adjacent pulses at the output of the divider unit. In the specific embodiment of such a priori art solution, the value K is defined in a way ensuring that the interval K$_{clk}$ exceeds the minimum 1/F$_S$ of the sampling interval specified for the used A/D converter. The value N determines the random variation range for these sampling intervals. This range is adapted to the conditions of the specific application. For example, the value of N is set up near to K when the signals to be digitized are broadband. Each of the input signal sample values, obtained in the process of sampling and formed into a given digital format, is stored in a memory.

The drawback of this priori art approach is the limited input signal bandwidth for which such sampling could be realistically used. Even in the best case, the clock frequency F$_{clk}$, determining the said sampling interval time increment D, could not exceed a few hundreds of MHz. Therefore this limits the bandwidth of the digitized analog signal down to half of that figure.

The block diagram of the present invention is presented in FIG. 1. The major difference, in comparison with the block diagram of the priori art case, is usage of the digitally controllable delay block. This block additionally delays the pulses at the output of the divider block by a time interval D×B, where D is the delay increment equal to 1/F$_{clk}$(M+1) and B is a pseudo-random integer ranged from zero to M. The integer B is generated in parallel with said integer A. The analog input signal is sampled at the time instants determined by said divided and delayed clock pulses. The obtained signal sample values are converted into a predetermined digital format and stored in a memory. FIG. 3 illustrates how the sampling pulse sequence is formed in the case of the present invention (for K=3, N=3 and M=3).

As can be seen, the minimum digital increment D of the sampling interval variation, in this case, is quarter of the clock interval 1/F$_{clk}$. In general, the value of D can be reduced in this way down to tens of picoseconds if take M>>1. In practice that can be achieved, for example, by using the Programmable Delay Chip MC10EP195 from "ON Semiconductor". Consequently, the bandwidth of the input analog signal, which can be digitized in this alias-free way, can be extended at least up to a few GHz. That is substantially more than can be provided by any of the present-day A/D converters. On the other hand, the minimum value of sampling intervals can be easily matched to the allowed sampling rate of specific A/D converters.

The maximum sampling rate F$_S$ of high-speed A/D converters, in many practical cases, is near to the highest clock frequency F$_{clk}$ allowable for thechnical implementation of the sampling pulse formers. In these cases, to sample the analog signal at the highest rate, said integer A should be varied in the minimum range (from one to two). However this results in the minimum sampling interval much smaller than 1/F$_{clk}$. In other words, the frequency F$_{clk}$ should be considerably lower than F$_S$. To adapt the present invention to sampling of analog input signals at the highest rate, said integer A is taken as equal to one, if said integer B is greater than its preceding value; otherwise it is equal to two. FIG. 4 illustrates the performance of this additional rule for the case when M=3.

As shown, the minimum value of sampling intervals is always equal to 1/F$_{clk}$ (independently from the value of M).

Implementation of the described approach to alias-free signal sampling is based on application of standard electronic blocks. Specifically, widely used pseudo-random number generators can be used to control the pulse divider and pulse delay blocks. However, to ensure that the parameter of the generated sampling pulse sequence meet the requirements of a specific application, a data memory (containing data of the required sampling pulse sequence) could be used as the source of the required random numbers. In this case, the present invention allows synthesizing a wide range of various type of sampling pulse sequences adapted to specific tasks of digital signal processing.

The above disclosure sets forth a number of embodiments of the present invention. Other arrangements or embodiments could be practiced under the teaching of the present invention and a set forth in the following claims.

The invention claimed is:

1. A method for sampling an analog input signal and storing digital presentation said samples in a memory, said method comprising:
    generating a sequence of clock pulses at a predetermined frequency F$_{clk}$;
    generating a pseudo-random integer A ranged from K to K+N where K and N are predetermined constants equal to one or greater than one, at every sampling pulse;
    dividing said sequence of clock pulses by said integer A to select one last pulse from every series of A clock pulses;
    forming a sequence of sampling pulses from said sequence of selected clock pulses by means of the following steps:
    (a) generating a pseudo-random integer B ranged from zero to M, where M are predetermined constants equal to one or greater than one, in parallel with said integer A;
    (b) delaying the selected clock pulse by value D×B, where D is equal to 1/F$_{clk}$(M+1); and
    sampling an analog input signal at said delayed clock pulse, and converting the said sample value to a predetermined digital format; and
    storing the current signal sample value in a memory.

2. The method of claim 1, wherein said method is adapted to sampling an analog input signal at the highest rate; and wherein said integer A is equal to one if said integer B is greater than its preceding value; otherwise it is equal to two.

3. A digitizer adapted to sample an analog input signal, store the digital values representing said signal sample values in a memory, and further process digitally said digital values; said digitizer comprising:
    a clock producing a sequence of electrical pulses at predetermined frequency;
    a random number generator adapted to generate a pseudo-random integer A ranged from K to K+N where K and N are predetermined constants equal to one or greater than one, the value of said integer A changing after each sampling pulse;
    a divider adapted to count said clock pulses and produce one output pulse for series of A clock pulses;
    means for forming a sequence of sampling pulses having:
    (a) a pseudo-random number generator adapted to generate a pseudo-random integer B ranged from one to M, said integer B changing after each sampling pulse;
    (b) a digitally controllable pulse delay block adapted to delay said selected pulse by a value D×B, where D is a minimum delay increment equal to 1/F$_0$(M+1);

an analog-to-digital ("A/D") converter adapted to sample said analog input signal and produce a digital output value that is a digital presentation of said analog input signal at each of said divided and delayed clock pulses;

a memory adapted to receive said digital output value from said A/D converter, and to store said digital output values after its receiving.

4. The apparatus of claim 3, wherein said random number generators are a memory adapted to produce cyclically a series of said integers A and B when triggered by a control signal, the series of said digital values A and B is before pre-calculated and stored in said memory.

* * * * *